(12) United States Patent
Arahara et al.

(10) Patent No.: US 11,275,319 B2
(45) Date of Patent: Mar. 15, 2022

(54) LITHOGRAPHY APPARATUS, DETERMINATION METHOD, AND METHOD OF MANUFACTURING AN ARTICLE

(71) Applicant: CANON KABUSHIKI KAISHA, Tokyo (JP)

(72) Inventors: Koshiro Arahara, Utsunomiya (JP); Kazumasa Tanaka, Tokyo (JP)

(73) Assignee: CANON KABUSHIKI KAISHA, Tokyo (JP)

(*) Notice: Subject to any disclaimer, the term of this patent is extended or adjusted under 35 U.S.C. 154(b) by 0 days.

(21) Appl. No.: 16/691,334

(22) Filed: Nov. 21, 2019

(65) Prior Publication Data

US 2020/0174384 A1    Jun. 4, 2020

(30) Foreign Application Priority Data

Nov. 30, 2018 (JP) .............................. JP2018-225476
Jul. 26, 2019 (JP) .............................. JP2019-137785

(51) Int. Cl.
*G03F 9/00* (2006.01)

(52) U.S. Cl.
CPC .......... *G03F 9/7088* (2013.01); *G03F 9/7015* (2013.01); *G03F 9/7026* (2013.01); *G03F 9/7049* (2013.01); *G03F 9/7069* (2013.01); *G03F 9/7076* (2013.01)

(58) Field of Classification Search
CPC .... G03F 9/7015; G03F 9/7026; G03F 9/7049; G03F 9/7069; G03F 9/7076; G03F 9/7088; G03F 7/70258; G03F 7/70516; G03F 7/7055; G03F 7/70683; G03F 7/70716; G03F 7/70775; G03F 7/7085;
(Continued)

(56) References Cited

U.S. PATENT DOCUMENTS 6,714,281 B1 * 3/2004 Amano ............... G03F 7/70641
                                              250/548
7,142,284 B2    11/2006 Mishima
9,984,453 B2 *  5/2018 Sugiyama ............ G06K 9/4604
(Continued)

FOREIGN PATENT DOCUMENTS

CN    107831638 A    3/2018
EP    0964308 A2    12/1999
(Continued)

*Primary Examiner* — Deoram Persaud
(74) *Attorney, Agent, or Firm* — Canon U.S.A., Inc. IP Division

(57) ABSTRACT

Provided is a lithography apparatus capable of detecting the abnormal holding of an original in a shorter period of time. The lithography apparatus is configured to form a pattern on a substrate through use of the original, and includes: a holding unit configured to hold the original on which a first mark is formed; a measuring unit configured to pick up an image of the first mark; and a control unit configured to: cause the measuring unit to obtain the image of the first mark on the original held by the holding unit with a focus position of the measuring unit being adjusted to a reference position; and determine that the original is being abnormally held by the holding unit when a change in a first contrast, which is a contrast of the image of the first mark with respect to a reference contrast, falls out of an allowable range.

27 Claims, 14 Drawing Sheets

(58) Field of Classification Search
CPC .. G03F 7/70908; G03F 9/7011; H01L 21/027; H01L 21/67063
See application file for complete search history.

(56) References Cited

U.S. PATENT DOCUMENTS

| | | | |
|---|---|---|---|
| 10,754,255 B2* | 8/2020 | Miyaharu | G03F 7/2024 |
| 2002/0154283 A1* | 10/2002 | Tanaka | G03B 27/54 |
| | | | 355/53 |
| 2003/0016338 A1* | 1/2003 | Yasuda | G03F 7/70866 |
| | | | 355/55 |
| 2003/0053057 A1* | 3/2003 | Mishima | G03F 9/7084 |
| | | | 356/401 |
| 2005/0062967 A1* | 3/2005 | Kobayashi | G03F 9/7076 |
| | | | 356/400 |
| 2007/0260419 A1 | 11/2007 | Hagiwara | |
| 2008/0068595 A1* | 3/2008 | Hagiwara | G03F 7/70683 |
| | | | 356/124 |
| 2008/0259349 A1* | 10/2008 | Ando | G03F 7/7085 |
| | | | 356/512 |
| 2009/0201514 A1* | 8/2009 | Sato | G03F 9/7026 |
| | | | 356/624 |
| 2011/0242520 A1* | 10/2011 | Kosugi | G03F 7/706 |
| | | | 355/77 |
| 2014/0111788 A1* | 4/2014 | Maeda | G01B 11/06 |
| | | | 355/72 |
| 2014/0307246 A1* | 10/2014 | Schuster | G03F 7/70775 |
| | | | 355/72 |
| 2014/0340663 A1 | 11/2014 | Scaccabarozzi et al. | |
| 2015/0042969 A1* | 2/2015 | Morikuni | G03F 9/7034 |
| | | | 355/55 |
| 2015/0158238 A1* | 6/2015 | Maeda | G03F 9/7088 |
| | | | 264/40.1 |
| 2016/0070175 A1* | 3/2016 | Akamatsu | G01B 11/272 |
| | | | 355/67 |
| 2018/0107125 A1* | 4/2018 | Egashira | G03F 7/70641 |
| 2020/0264524 A1* | 8/2020 | Egashira | G01B 11/0608 |

FOREIGN PATENT DOCUMENTS

| | | |
|---|---|---|
| JP | 2004-186313 A | 7/2004 |
| KR | 10-2003-0094677 A | 12/2003 |
| TW | 200610031 A | 3/2006 |

* cited by examiner

LITHOGRAPHY APPARATUS, DETERMINATION METHOD, AND METHOD OF MANUFACTURING AN ARTICLE

BACKGROUND

Field of the Disclosure

The present disclosure relates to a lithography apparatus, a determination method, and a method of manufacturing an article.

Description of the Related Art

In the manufacturing of a semiconductor device, a MEMS, a flat panel display, or other such article, an exposure apparatus being an example of a lithography apparatus transfers a pattern drawn on an original (reticle or mask) onto a substrate (wafer or panel). As the pattern to be formed on the substrate is becoming finer, it is required to align the pattern to be transferred onto the substrate with higher accuracy.

The causes of a decrease in alignment accuracy include a foreign substance sandwiched between the original and an original stage on which the original is held. When the original is held on the original stage with a foreign substance being sandwiched between the original and the original stage, the pattern to be transferred onto the substrate may be misaligned. In view of this, the exposure apparatus is required to include means capable of detecting that the original has been held on the original stage under an abnormal state due to the sandwiched foreign substance or other such cause.

In Japanese Patent Application Laid-Open No. 2004-186313, there is disclosed an exposure apparatus configured to determine the presence or absence of a foreign substance by measuring the height of an original through use of a measuring unit. In Japanese Patent Application Laid-Open No. 2004-186313, the height of the original is obtained from a change in contrast exhibited when the measurement is repeatedly performed while changing the focal length of the measuring unit.

In Japanese Patent Application Laid-Open No. 2004-186313, the height of the original is measured by repeatedly performing focus measurement while changing the focal length of the measuring unit, and hence there is a problem in that much time is required to determine the presence or absence of a foreign substance.

SUMMARY

Therefore, the present invention has an object to provide a lithography apparatus, a determination method, and a method of manufacturing an article, which are capable of detecting an abnormal holding of an original in a shorter period of time.

In order to solve the above-mentioned problem, according to at least one embodiment of the present invention, there is provided a lithography apparatus configured to form a pattern on a substrate through use of an original, the lithography apparatus including: a holding unit configured to hold the original on which a first mark is formed; a measuring unit configured to pick up an image of the first mark; and a control unit configured to: cause the measuring unit to obtain the image of the first mark on the original held by the holding unit with a focus position of the measuring unit being adjusted to a reference position; and determine that the original is being abnormally held by the holding unit when a change in a first contrast, which is a contrast of the image of the first mark with respect to a reference contrast, falls out of an allowable range.

Further features of the present invention will become apparent from the following description of exemplary embodiments with reference to the attached drawings.

DESCRIPTION OF THE EMBODIMENTS

Exemplary embodiments of the present invention are described in detail with reference to the attached drawings. In each figure, like components are denoted by like reference symbols, and their duplicate descriptions are omitted.

First Embodiment

Figure 1:
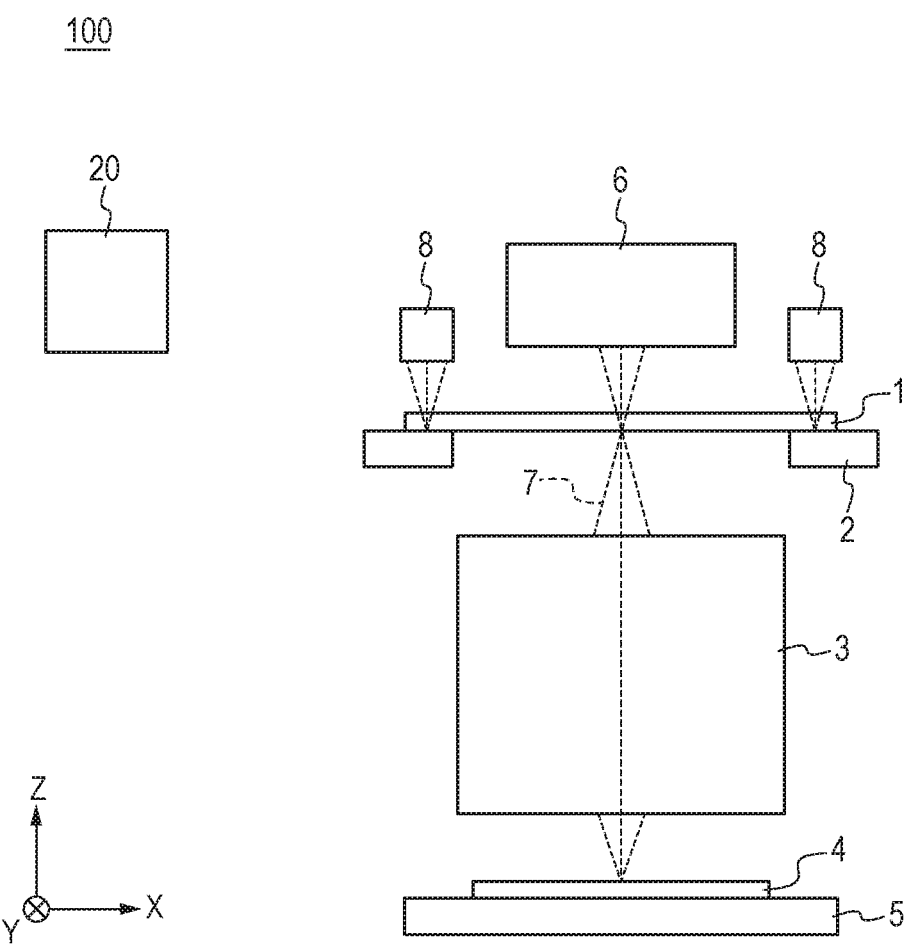
FIG. 1 is a view for illustrating an exposure apparatus.

In a first embodiment of the present invention, an example of using an exposure apparatus as a lithography apparatus is described. FIG. 1 is a view for illustrating an exposure apparatus 100. The exposure apparatus 100 includes an original stage (holding unit) 2, a projection optical system 3, a substrate stage 5, an illumination optical system 6, a measuring unit 8, and a control unit 20. The exposure apparatus 100 transfers a pattern onto a substrate (wafer) 4 by irradiating the substrate 4 with exposure light 7 through an original (reticle or mask) 1 on which the pattern is formed. In the following description, a direction parallel to an optical axis of the projection optical system 3 is defined as a Z-axis direction, and two directions orthogonal to each other in a plane perpendicular to the Z-axis direction are defined as an X-axis direction and a Y-axis direction.

The original 1 held on the original stage 2 is illuminated with light emitted from a light source (not shown) through the illumination optical system 6. Examples of the light source include a high-pressure mercury lamp and an excimer laser. When the light source is an excimer laser, the light source is not required to be provided inside a chamber of the exposure apparatus 100, and may be provided externally. A pattern to be transferred and an original mark described later are formed on the original 1. The light illuminating the original 1 passes through the projection optical system 3 to reach the substrate 4. The original 1 is a reticle or a mask on which a predetermined pattern is formed, and transmits the light applied from the illumination optical system 6. The substrate 4 is, for example, a silicon wafer, a glass plate, or a film-like substrate.

The original stage 2 includes suction means to suck and hold the original 1. As a method of sucking the original 1 by the suction means of the original stage 2, there can be employed a vacuum suction method, an electrostatic suction method, or another suction method. The suction means can also include a plurality of suction pads arranged on a holding surface for holding the original 1 on the original stage 2. The original stage 2 is described later in detail.

The image of the pattern on the original 1 is formed and transferred onto a photosensitive medium (for example, resist) applied to the substrate 4 through the projection optical system 3. The substrate stage 5 includes suction means for holding the substrate 4. As a method of sucking the substrate 4 by the suction means, there can be employed a vacuum suction method, an electrostatic suction method, or another suction method. The substrate stage 5 is configured to be movable. Further, a plurality of shot regions are repeatedly exposed on the substrate 4 while the substrate stage 5 is two-dimensionally moved stepwise along a plane perpendicular to the optical axis of the projection optical system 3. This is an exposure method called "step-and-repeat method". There is also an exposure method called "step-and-scan method", in which the exposure is performed by performing a scan while synchronizing the original stage 2 and the substrate stage 5, and the first embodiment can be similarly applied to an exposure apparatus that employs such a method.

The measuring unit 8 is arranged in the upward direction (positive Z-axis direction) of the original stage 2, and measures the original mark provided on the original 1 and a reference mark provided on the original stage. In FIG. 1, two measuring units 8 are arranged, but the number of measuring units 8 is not limited to two. The measuring unit 8 is described later in detail.

The control unit 20 controls, for example, the operation and adjustment of each of the components of the exposure apparatus 100, to thereby control exposure processing for forming a pattern on the substrate 4. The control unit 20 is, for example, a field programmable gate array (FPGA) or other such programmable logic device (PLD), an application specific integrated circuit (ASIC), a computer into which a program is built, or an information processing apparatus that can be configured by combining all or a part of those. The control unit 20 includes: a ROM configured to store information including programs and data; and a RAM configured to store a work area for a CPU and temporary data. The control unit 20 also includes a magnetic storage apparatus (HDD) (not shown) capable of storing data having a larger capacity than those of the ROM and the RAM. The control unit 20 further includes a drive configured to load a CD, a DVD, a memory card, or other such external medium to read and write data from/to the external medium. In the first embodiment, it is assumed that at least one of the ROM, the RAM, the magnetic storage apparatus, and the drive is set as a storing unit, and the information including programs and data is held in the storing unit. The control unit 20 may be configured integrally with other parts of the exposure apparatus 100 (in a common casing), or may be configured separately from the other parts of the exposure apparatus 100 (in a separate casing).

Figure 2A:
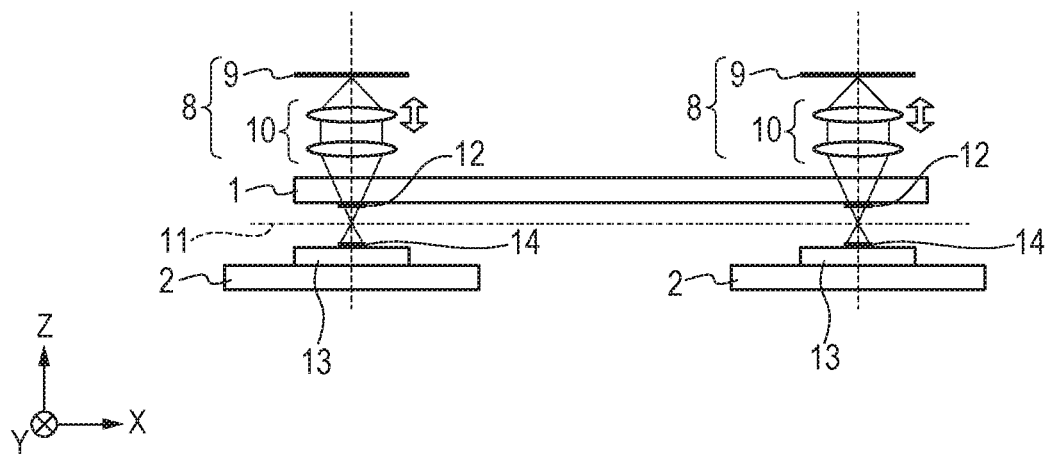
FIG. 2A is a view for illustrating a measuring unit, an original stage, and an original held on the original stage.

Next, the original stage 2 and the measuring unit 8 are described. FIG. 2A is a view for illustrating the measuring unit 8, the original stage 2, and the original 1 held on the original stage 2. As illustrated in FIG. 2A, an original mark 12 is arranged on the original 1. In addition, a plate 13 is arranged on the original stage 2, and a reference mark 14 is arranged on the plate 13. In this case, the reference mark 14 is arranged at a reference position defined in advance with respect to the optical axis of the projection optical system 3.

The measuring unit 8 also includes a light receiving element 9 and an optical element 10, and measures the original mark 12 on the original 1 and the reference mark 14 on the original stage 2 through the original 1. The direction of the optical axis of the measuring unit 8 is a direction along the Z-axis direction, and a focus position 11 of the measuring unit 8 is indicated by the dotted line. The light receiving element 9 is an element configured to receive light from the original mark 12 and the reference mark 14 through the optical element 10 to obtain the images of the original mark 12 and the reference mark 14, and can include, for example, a CCD, a CMOS, or other such image pickup element. The light receiving element 9 is arranged at a position conjugate with the focus position 11 of the measuring unit 8. The optical element 10 includes at least two lenses, and images the light from the original mark 12 and the reference mark 14 onto the light receiving element 9. The measuring unit 8 adjusts the focus position 11 by driving at least one optical element 10 in the Z-axis direction. The control unit 20 can obtain a positional relation between the original 1 and the original stage 2 by causing the measuring unit 8 to measure the original mark 12 and the reference mark 14.

Figure 2B:
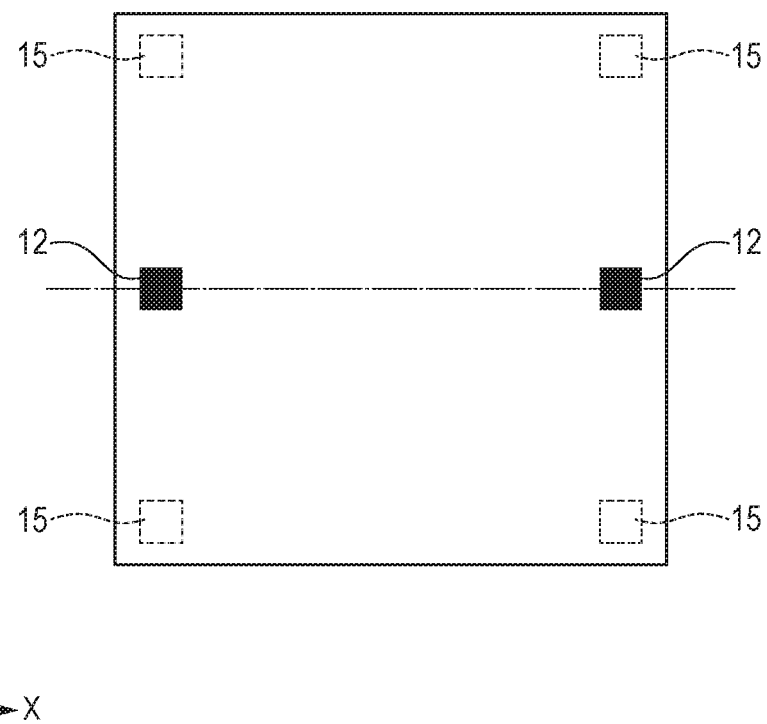
FIG. 2B is a view for illustrating an original mark on the original, a reference mark on the original stage, and suction pads on a substrate stage.

FIG. 2B is a view for illustrating the original mark 12 on the original 1, the reference mark 14 on the original stage 2, and suction pads 15 serving as the suction means of the substrate stage 5. The original 1 is placed on the suction pads 15 provided on the original stage 2, and the original stage 2 sucks and holds the original 1 by the suction pads 15. The original mark 12 and the reference mark 14 can include marks having other specific shapes including a circle, a cross, an L-shape, a bar, a square, an inverted V-shape, and a mountain shape.

Now, focus measurement processing and alignment processing to be performed when the original 1 is held on the original stage 2 are described. In the focus measurement processing, a reference focus position (hereinafter referred to as "reference position") is determined based on contrasts of the image of the original mark 12 and the image of the reference mark 14. First, the control unit 20 obtains the contrasts of the images of the original mark 12 and the reference mark 14 that have been obtained by the light receiving element 9 of the measuring unit 8. Then, the control unit 20 controls the measuring unit 8 so as to adjust the focus position 11 to a position at which the contrasts of the images of the two marks become equal to each other. Under this control, the focus position 11 is adjusted so as to be positioned between the original mark 12 (original 1) and the reference mark 14 (original stage 2). In this manner, the focus position 11 adjusted so that the contrast of the image of the original mark 12 (first contrast) and the contrast of the image of the reference mark 14 (second contrast) are equal to each other is set as the reference position. In another case, a middle position of the focus positions 11 at which the graph lines of the respective contrasts of the original mark 12 and the reference mark 14 peak may be used as the reference position.

Figure 3:
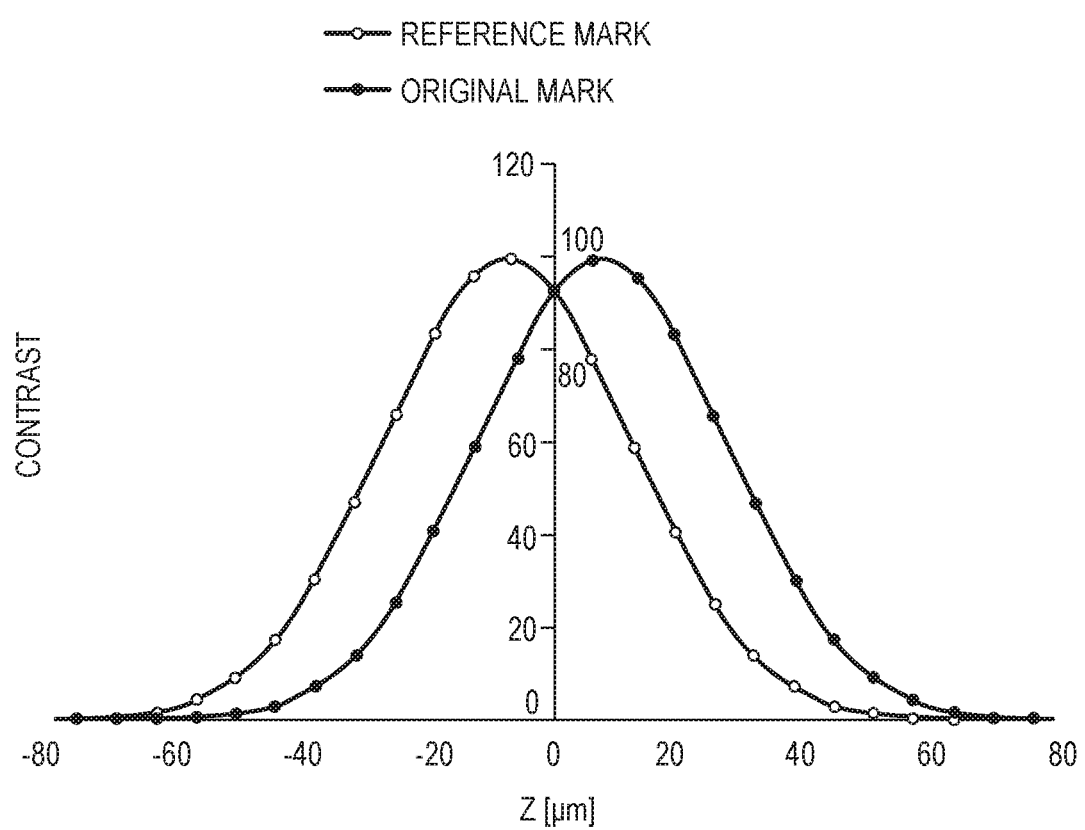
FIG. 3 is a graph for showing a relation between a focus position and a contrast of an image of a mark.

Now, the contrasts obtained from the image of the original mark and the image of the reference mark are described. FIG. 3 is a graph for showing a relation between the focus position 11 and the contrasts of the images of the marks. In the graph of FIG. 3, the vertical axis indicates the contrast of the image, and the horizontal axis indicates the focus position 11. A graph line connected by black circles indicates the first contrast, and a graph line connected by white circles indicates the second contrast. The focus position 11 at the intersection point of the graph line of the reference mark and the graph line of the original mark is obtained as the reference position. In the graph of FIG. 3, the reference position is defined to be the origin of the horizontal axis (Z=0 (μm)). In FIG. 3, the original mark 12 and the reference mark 14 are set to have the same shape, and hence the graph line of the reference mark and the graph line of the original mark have the same shape. However, the original mark 12 and the reference mark 14 are not limited to the marks having the same shape, and the first embodiment can be applied even to the graph line of the reference mark and the graph line of the original mark having mutually different shapes.

Then, in the alignment processing, the control unit 20 obtains the positions of the original mark 12 and the reference mark 14 in the XY plane based on the images of the original mark 12 and the reference mark 14 obtained by the measuring unit 8. The control unit 20 then obtains a positional relation between the original 1 and the original stage 2 from the positions of the original mark 12 and the reference mark 14 in the XY plane. The control unit 20 controls the substrate stage 5 so that the image of the pattern of the original 1 is projected at a predetermined position on the substrate 4 during the exposure based on the positional relation between the original 1 and the original stage 2.

In this case, by holding the reference position in the storing unit, the control unit 20 can obtain the reference position without being required to measure the mark each time the original is held on the original stage. When there are a plurality of originals 1, the reference position may be measured for each of the plurality of originals 1 to hold a different reference position for each of the originals 1. An identifier is assigned to each of the plurality of originals 1, and the control unit 20 can obtain the respective reference positions of the plurality of originals 1 by holding the identifier of the original 1 together with the reference position.

Figure 4:
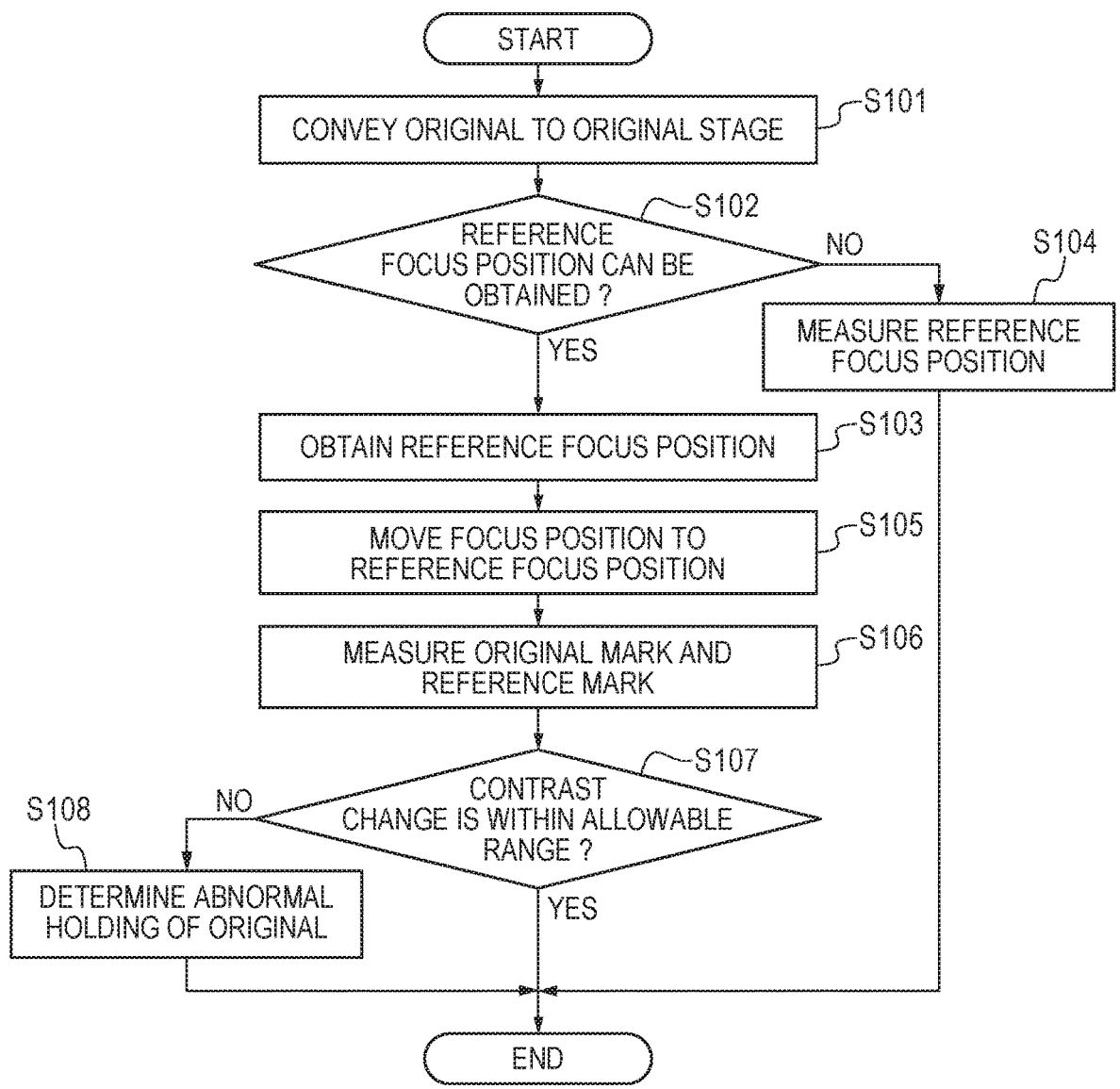
FIG. 4 is a flow chart for illustrating a determination method for an abnormal holding of an original according to a first embodiment of the present invention.

Next, a determination method for an abnormal holding of the original 1 is described. FIG. 4 is a flow chart for illustrating the determination method for the abnormal holding of the original 1 according to the first embodiment. Processing for the determination method illustrated in FIG. 4 is executed by the control unit 20. The control unit 20 may execute the processing for the determination method for the abnormal holding of the original 1 before the alignment processing, or may execute the processing for the determination method for the abnormal holding of the original 1 after the alignment processing. The reference position is obtained by executing the processing for the determination method for the abnormal holding of the original 1 before the alignment processing, and hence it is possible to omit the focus measurement processing.

In Step S101, the control unit 20 causes an original conveyor (not shown) to convey the original 1 to the original stage 2. At this time, the control unit 20 controls the original conveyor to hold the original 1 on the original stage 2 by setting a target position to a position at which the original mark 12 on the original 1 is superimposed on the reference mark 14 in the Z-axis direction. Under this control, the optical path of light from the original mark 12 to the measuring unit 8 and the optical path of light from the reference mark 14 to the measuring unit 8 overlap each other.

In Step S102, the control unit 20 determines whether or not the reference position can be obtained, and when determining that the reference position can be obtained, advances the processing to Step S103. Meanwhile, when determining that the reference position cannot be obtained, the control unit 20 advances the processing to Step S104.

In this case, the control unit 20 determines that the reference position can be obtained when the reference position is held in the storing unit, and determines that the reference position cannot be obtained when the reference position is not held in the storing unit. In another case, the control unit 20 may determine whether or not the reference position can be obtained by holding information on a history of the original 1 held on the original stage 2 in the storing unit in advance. That is, the control unit 20 may determine that the reference position can be obtained for the original 1 that has previously been held on the original stage 2, and may determine that the reference position cannot be obtained for the original 1 to be held on the original stage 2 for the first time.

In Step S103, the control unit 20 obtains a reference position. When the reference position is held for each of the plurality of originals 1, the reference position corresponding to the original 1 held on the original stage 2 in Step S101 is obtained.

In Step S104, the control unit 20 controls the measuring unit 8 to perform the focus measurement processing. That is, the control unit 20 causes the measuring unit 8 to adjust the focus position 11 of the measuring unit 8 to a position at which the first contrast and the second contrast are equal to each other to obtain the reference position. Then, the control unit 20 holds the obtained reference position in the storing unit. In this case, when the reference position is held for each original 1, the control unit 20 also holds in the storing unit the identifier of the original 1 held on the original stage 2 in Step S101 together with the reference position. The control unit 20 may also transmit the reference position to an external information processing apparatus to allow the external information processing apparatus to hold the reference position. In this case, in Step S103, the control unit 20 requests the reference position from the external information processing apparatus, and receives the reference position from the external information processing apparatus to obtain the reference position. In Step S102, the control unit 20 also queries the external information processing apparatus as to whether or not the reference position can be obtained, to thereby determine whether or not the reference position can be obtained.

In Step S105, the control unit 20 controls the measuring unit 8 to move the focus position 11 of the measuring unit 8 to the reference position obtained in Step S103. The measuring unit 8 moves the focus position 11 to the reference position by driving at least one optical element 10 in the Z-axis direction.

In Step S106, the control unit 20 causes the measuring unit 8 to measure the original mark 12 and the reference mark 14, and obtains the first contrast and the second contrast at the reference position.

In Step S107, the control unit 20 obtains a change amount of the first contrast at the reference position with the second contrast (reference contrast) being used as a reference. Then, the control unit 20 determines whether or not the change amount of the first contrast falls out of an allowable range defined in advance. When determining that the change amount of the first contrast is within the allowable range, the control unit 20 brings the processing to an end. When determining that the change amount of the first contrast falls out of the allowable range, the control unit 20 advances the processing to Step S108. In this case, the change amount of the first contrast can be set to a difference or a ratio between the first contrast and the second contrast at the reference position, and when the change amount of the first contrast is larger than a predetermined threshold value (value defined in advance), the control unit 20 can determine that the change amount of the first contrast falls out of the allowable range.

In Step S108, the control unit 20 determines that the original 1 is being abnormally held on the original stage 2. In this case, when determining in Step S108 that the original 1 is being abnormally held on the original stage 2, the control unit 20 may interrupt or cancel the exposure processing for exposing the substrate 4 (processing for forming a pattern on the substrate 4). The control unit 20 may also output an error through a user interface.

Figure 5:
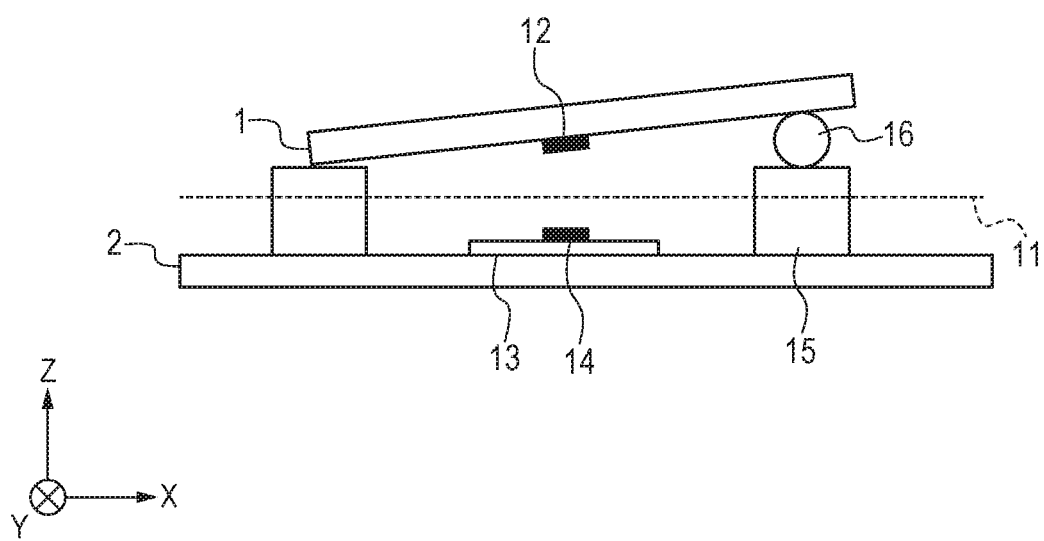
FIG. 5 is a view for illustrating the original and the original stage that appear when the original has been abnormally held.

Next, a case in which the original 1 is being abnormally held on the original stage 2 is described. FIG. 5 is a view for illustrating the original 1 and the original stage 2 that appear when the original 1 has been abnormally held. When a foreign substance 16 adheres to the original 1 or the suction pad 15, the foreign substance 16 is sandwiched between the original 1 held on the original stage 2 and the original stage 2 (suction pad 15). Therefore, as compared to a position at which the original 1 is normally held without the foreign substance 16, the original 1 is held with the position being displaced in the upward direction (positive Z-axis direction), to thereby displace the position of the original mark 12 in the upward direction (positive Z-axis direction). When the original mark 12 is displaced in the upward direction, the first contrast with respect to the focus position 11 is changed. In this case, the original 1 being abnormally held on the original stage 2 refers to, for example, a state under which the original 1 is held on the original stage 2 with a foreign substance being sandwiched between the original 1 and the original stage 2. However, the present invention is not limited to such a state, and the original 1 being abnormally held on the original stage 2 includes the original 1 failing to be normally held on the original stage 2 or the original 1 being held by the original stage 2 in an abnormal manner. For example, the original 1 being abnormally held on the original stage 2 also includes the original 1 being held by the original stage 2 in an abnormal manner due to the deformation of the suction pad 15 or the original 1.

Figure 6:
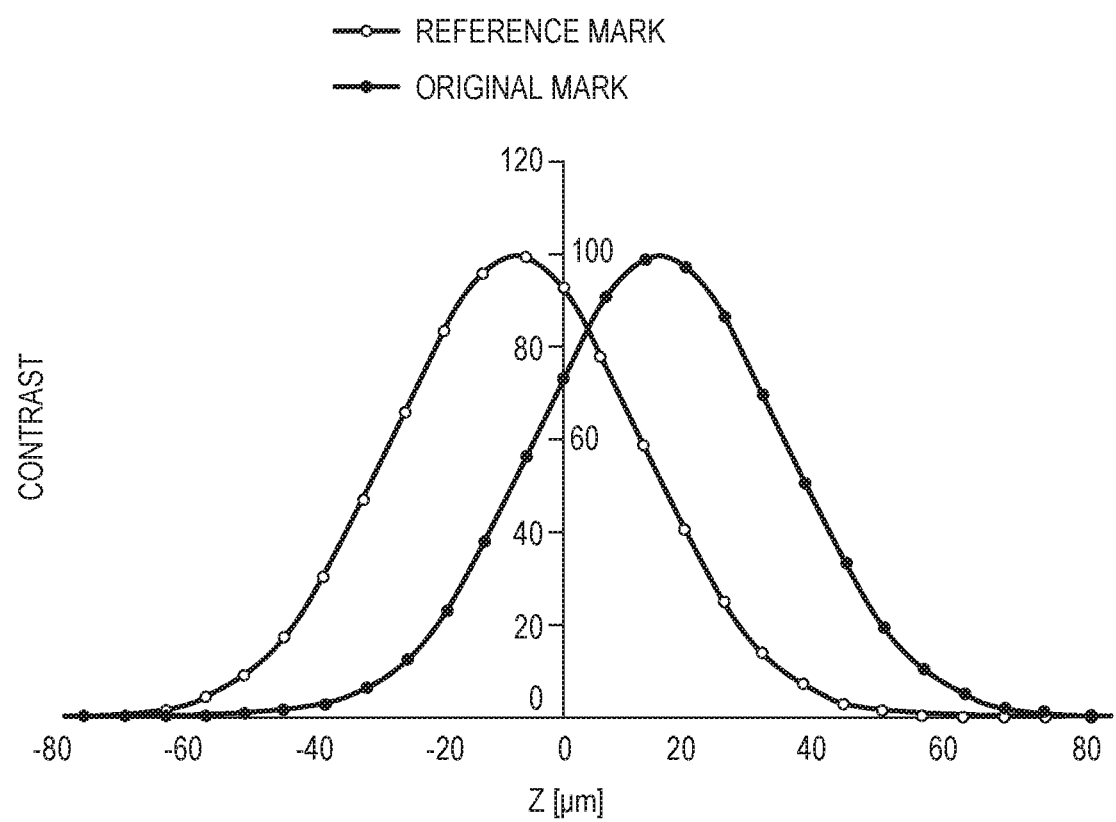
FIG. 6 is a graph for showing changes in contrasts of the images of the marks in the first embodiment.

FIG. 6 is a graph for showing changes in contrasts of the images of the marks in the first embodiment. When the original 1 has been abnormally held, a graph line regarding the original mark 12 is moved in the horizontal axis direction compared to a case in which the original 1 is normally held. In FIG. 6, the contrasts of the images of the original mark 12 and the reference mark 14 exhibited when the original mark 12 is measured with the original mark 12 on the original 1 being displaced in the upward direction are shown. As compared to the graph of FIG. 3, the first contrast is changed in that the first contrast is lowered at the reference position (Z=0). Meanwhile, the second contrast is not changed because of not being affected by the abnormal holding of the original 1. This allows the change in the first contrast to be obtained with the second contrast been used as a reference. Therefore, in Step S107, the control unit 20 can determine whether or not the original 1 is being abnormally held on the original stage 2 by determining whether or not the difference or the ratio between the first contrast and the second contrast at the reference position falls out of the allowable range defined in advance.

In this case, in Step S107, the control unit 20 may obtain the change amount of the first contrast at the reference position by taking as a reference the first contrast (reference contrast) at the reference position exhibited when the reference position is obtained in Step S104. That is, the change amount of the first contrast may be set to a difference or a ratio between the first contrast exhibited when the reference position is obtained in Step S104 and the first contrast exhibited when the original mark 12 is measured in Step S107. In this case, in Step S104, the control unit 20 holds the first contrast at the reference position in the storing unit.

As described above, when the foreign substance 16 adheres to the original 1 or the suction pad 15, the foreign substance 16 is sandwiched between the original 1 held on the original stage 2 and the original stage 2 (suction pad 15). At this time, the position of the original mark 12 is displaced in the upward direction (positive Z-axis direction). In addition, the original mark 12 closer to the suction pad 15 at which the foreign substance 16 is sandwiched exhibits a larger displacement amount in the upward direction, and the change amount of the first contrast becomes larger. Therefore, the control unit 20 can identify the suction pad 15 at which the foreign substance 16 is sandwiched based on the positions of the original mark 12 and the suction pad 15, and the magnitude of the change amount of the first contrast of the original mark 12.

Figure 7:
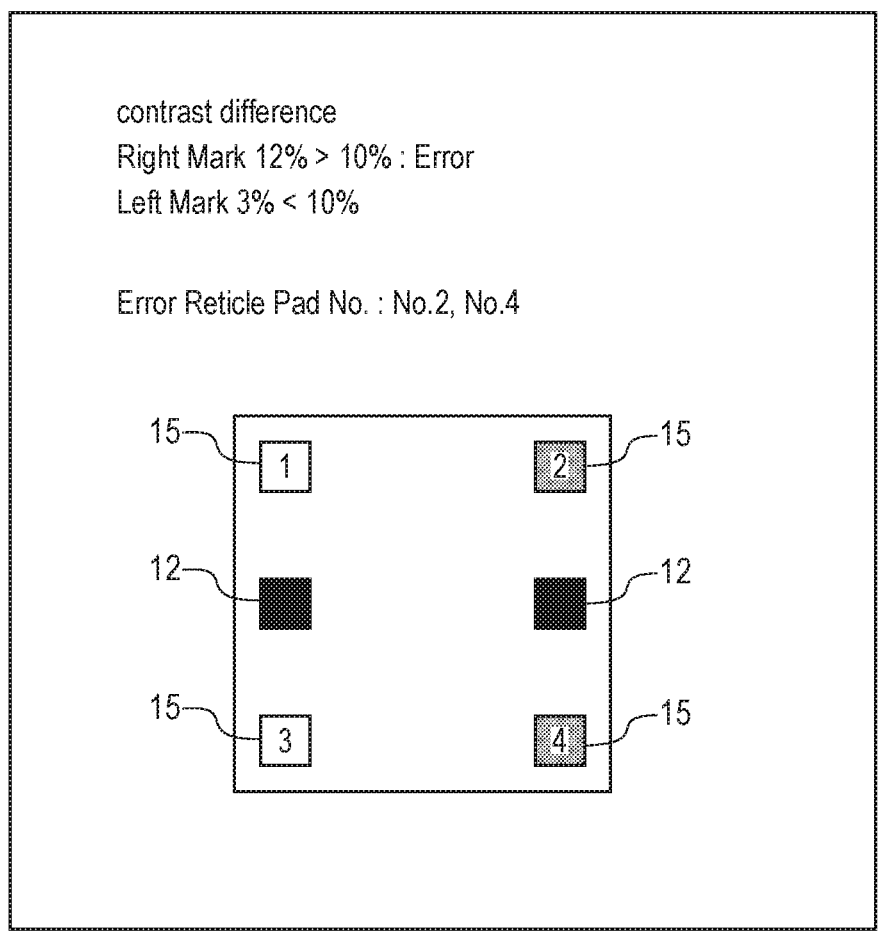
FIG. 7 is a diagram for illustrating a user interface in the first embodiment.

In this case, in Step S108, when outputting the error through the user interface, the control unit 20 may display on the user interface information for identifying the suction pad 15 at which the foreign substance 16 is sandwiched. FIG. 7 is a diagram for illustrating the user interface in the first embodiment. In the example illustrated in FIG. 7, the contrast change amount of the right original mark 12 of the two left and right original marks 12 is 12%, which indicates that the threshold value of 10% is exceeded. The example illustrated in FIG. 7 also indicates that there is a possibility that the foreign substance 16 may be sandwiched at two suction pads 15 (No. 2 and No. 4) close to the original mark 12 on the right side among the four suction pads 15. In the first embodiment, the two suction pads 15 at which the foreign substance 16 may be sandwiched are identified, but it is also possible to identify one suction pad involved in the abnormal holding when the original marks 12 corresponding to the respective suction pads 15 are arranged on a one-to-one basis.

As described above, according to the first embodiment, it is possible to detect the abnormal holding of an original in a shorter period of time by determining whether or not the change in the contrast of the image of the original mark is within the allowable range.

Second Embodiment

Next, a lithography apparatus according to a second embodiment of the present invention is described. It is to be noted that matters not mentioned below may be conformed to the first embodiment. In the second embodiment, an embodiment in which information indicating a relation between the focus position 11 and the first contrast is used to detect the abnormal holding of the original 1 based on a change in the first contrast is described.

In FIG. 6, when the first contrast is changed, the entire graph line is moved in the horizontal axis direction without changing the shape of the graph line. Therefore, the movement amount of the entire graph line in the horizontal axis direction can be obtained through use of the change amount of the first contrast at the reference position (Z=0) and the information (first contrast information piece) indicating the relation between the focus position 11 and the first contrast. In short, the change amount of the focus position 11 with respect to the original mark 12 can be obtained. When the obtained change amount of the focus position 11 falls out of the allowable range defined in advance, it is possible to determine that the original 1 is being abnormally held on the original stage 2.

In view of the foregoing, in the second embodiment, the change amount of the first contrast and the first contrast information piece are used to detect the abnormal holding of the original 1.

Figure 8:
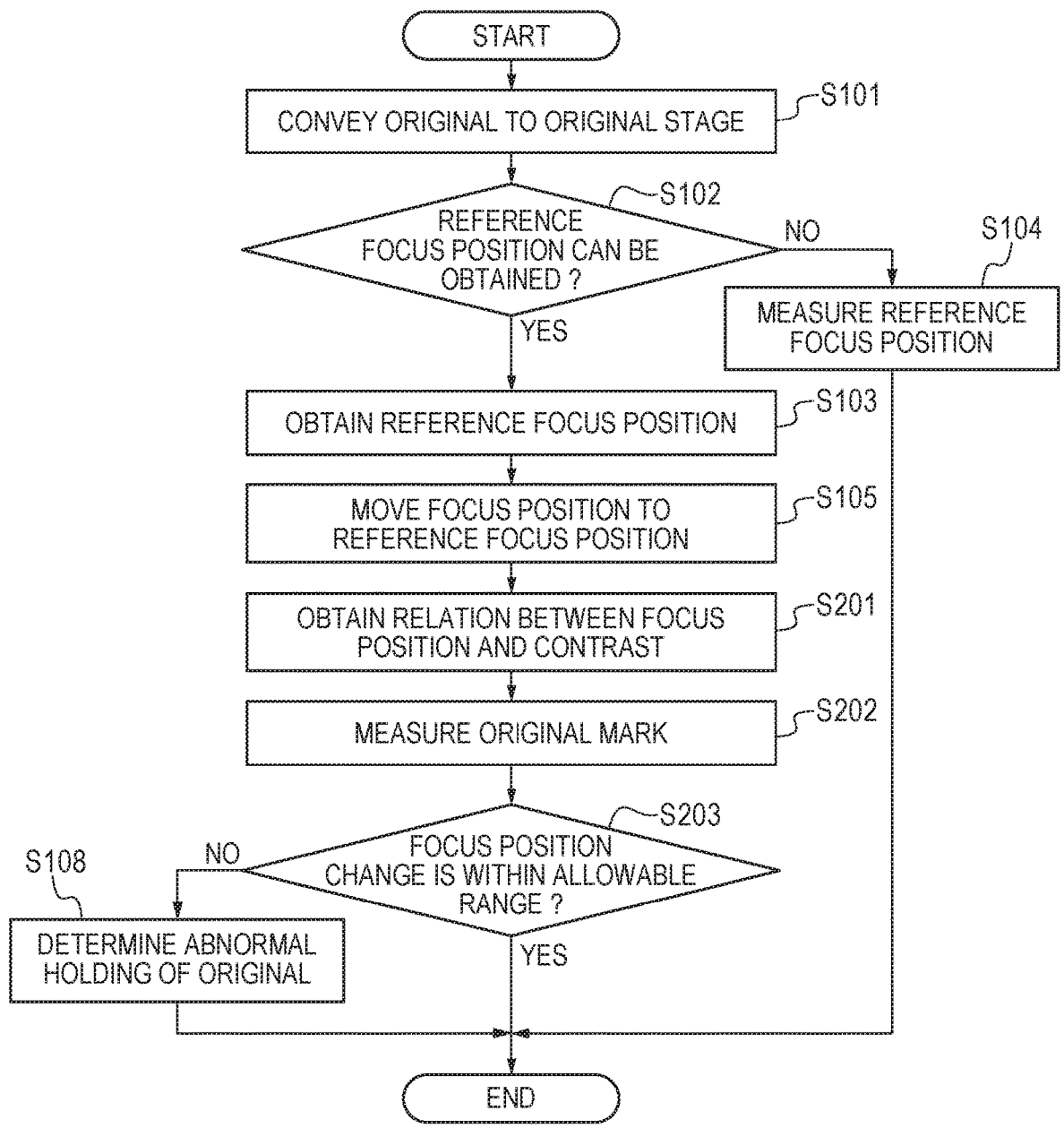
FIG. 8 is a flow chart for illustrating a determination method for the abnormal holding of an original according to a second embodiment of the present invention.

FIG. 8 is a flow chart for illustrating a determination method for the abnormal holding of the original according to the second embodiment. The flow chart of FIG. 8 is different from the flow chart of FIG. 4 in Step S201 to Step S203. Therefore, the descriptions of the other steps are omitted.

In Step S201, the control unit 20 obtains the first contrast information piece obtained in advance from the storing unit. In this case, the control unit 20 measures the original mark 12 while changing the focus position 11 with the original 1 being normally held on the original stage 2, and holds the first contrast information piece in the storing unit. As a format for holding the first contrast information piece, the first contrast information piece is held in the storing unit as a discrete data set of the focus position 11 and the first contrast. As the format for holding the first contrast information piece, information on a function obtained by approximating the discrete data set by a Gaussian function or a higher-order function using the focus position 11 as a variable may also be used. When a change in the contrast is small, information on a function obtained by approximating the discrete data set by a linear function using the focus position 11 as a variable may be used as well. The first contrast information piece may also be obtained by simulation. In another case, an external information processing apparatus may hold the first contrast information piece. In this case, the control unit 20 obtains the first contrast information piece from the external information processing apparatus.

In Step S202, the control unit 20 causes the measuring unit 8 to measure the original mark 12, and obtains the first contrast at the reference position. In this case, the control unit 20 is not required to measure the reference mark 14 and obtain the second contrast.

In Step S203, the control unit 20 obtains the change amount of the focus position 11 with respect to the original mark 12 through use of the first contrast information piece obtained in Step S201 and the first contrast at the reference position obtained in Step S202. That is, the control unit 20 obtains the movement amount of the graph line regarding the original mark 12 shown in FIG. 6 in the horizontal axis direction with respect to the graph line regarding the original mark 12 shown in FIG. 3. Then, the control unit 20 determines whether or not the change amount of the focus position 11 with respect to the original mark 12 falls out of the allowable range defined in advance, and when determining that the change amount is within the allowable range, brings the processing to an end. When determining that the change amount falls out of the allowable range, the control unit 20 advances the processing to Step S108.

As described above, according to the second embodiment, it is possible to detect the abnormal holding of the original in a shorter period of time by determining whether or not the change in the focus position 11 with respect to the original mark 12 is within the allowable range through use of the relation between the focus position and the contrast of the image of the original mark.

Third Embodiment

Next, a lithography apparatus according to a third embodiment of the present invention is described. It is to be noted that matters not mentioned below may be conformed to the first embodiment and the second embodiment. In the third embodiment, an embodiment in which the abnormal holding of the original 1 is detected in consideration of a change in the first contrast due to the positional displacement of the measuring unit 8 is described. The measuring unit 8 in the third embodiment is configured to be movable within the XY plane. When measuring the original mark 12 and the reference mark 14, the measuring unit 8 is moved to a position illustrated in FIG. 1, but when the exposure processing is performed, the measuring unit 8 is moved to a retracted position spaced apart from the optical path of the exposure light 7. In this case, when the measuring unit 8 is moved again to the position for measuring the original mark 12 and the reference mark 14, the position of the measuring unit 8 in the Z-axis direction may be displaced with respect to the original stage 2. That is, there is a possibility that the relative position of the measuring unit 8 in the Z-axis direction with respect to the original stage 2 exhibited when the reference position is measured and the relative position of the measuring unit 8 in the Z-axis direction with respect to the original stage 2 exhibited when the abnormal holding of the original 1 is determined may be different from each other. The first contrast is changed not only when the original 1 is being abnormally held but also when the relative position of the measuring unit 8 in the Z-axis direction with respect to the original stage 2 is changed. Therefore, there is a possibility that the abnormal holding of the original 1 may be erroneously determined when the abnormal holding of the original 1 is determined based on the change in the first contrast on the assumption that the position of the measuring unit 8 in the Z-axis direction is not changed.

Figure 9:
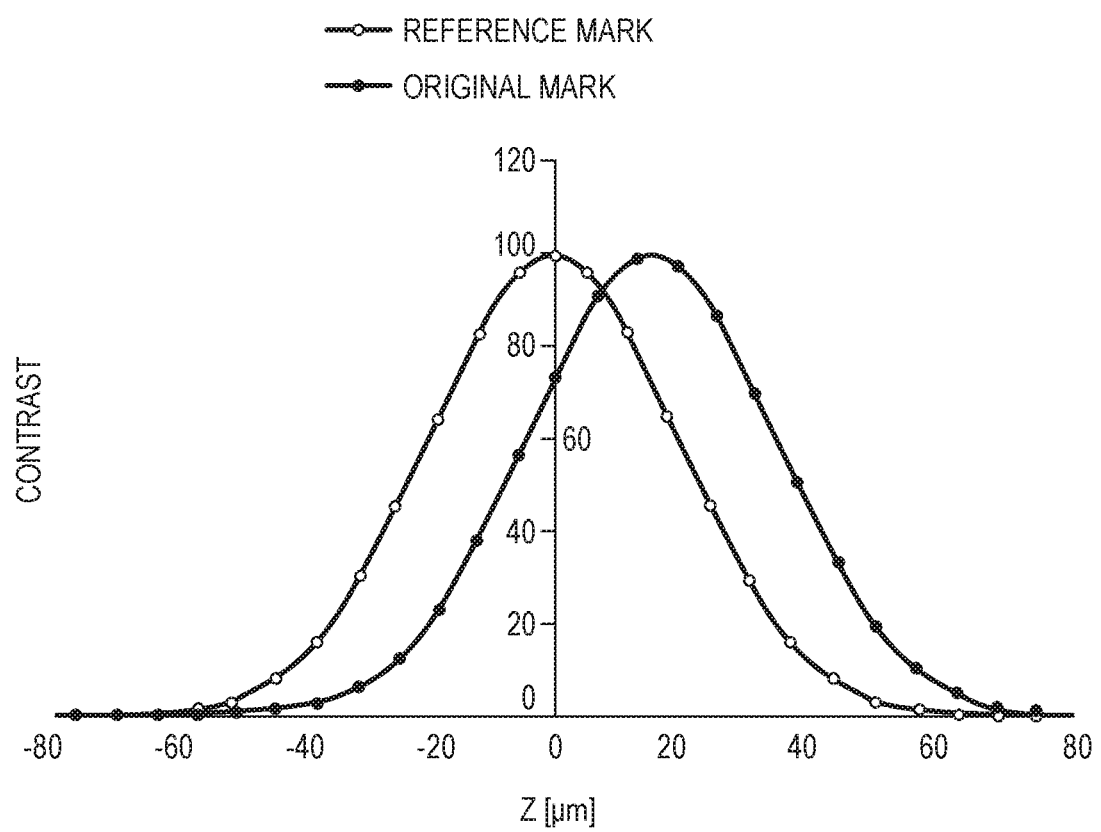
FIG. 9 is a graph for showing changes in contrasts of the images of the marks due to a positional change of a measuring unit.

FIG. 9 is a graph for showing changes in contrasts of the images of the marks due to a positional change of the measuring unit 8. When the position of the measuring unit 8 is changed in the Z-axis direction, the first contrast graph line and the second contrast graph line are changed as compared to the graph of FIG. 3. This is because the position of the measuring unit 8 in the Z-axis direction has been changed in the downward direction. Therefore, even when the original 1 is not being abnormally held, the first contrast at the reference position can be changed when the position of the measuring unit 8 is changed in the Z-axis direction.

In view of the foregoing, in the third embodiment, the abnormal holding of the original 1 is detected in consideration of the change in the first contrast due to the positional change of the measuring unit 8.

Figure 10:
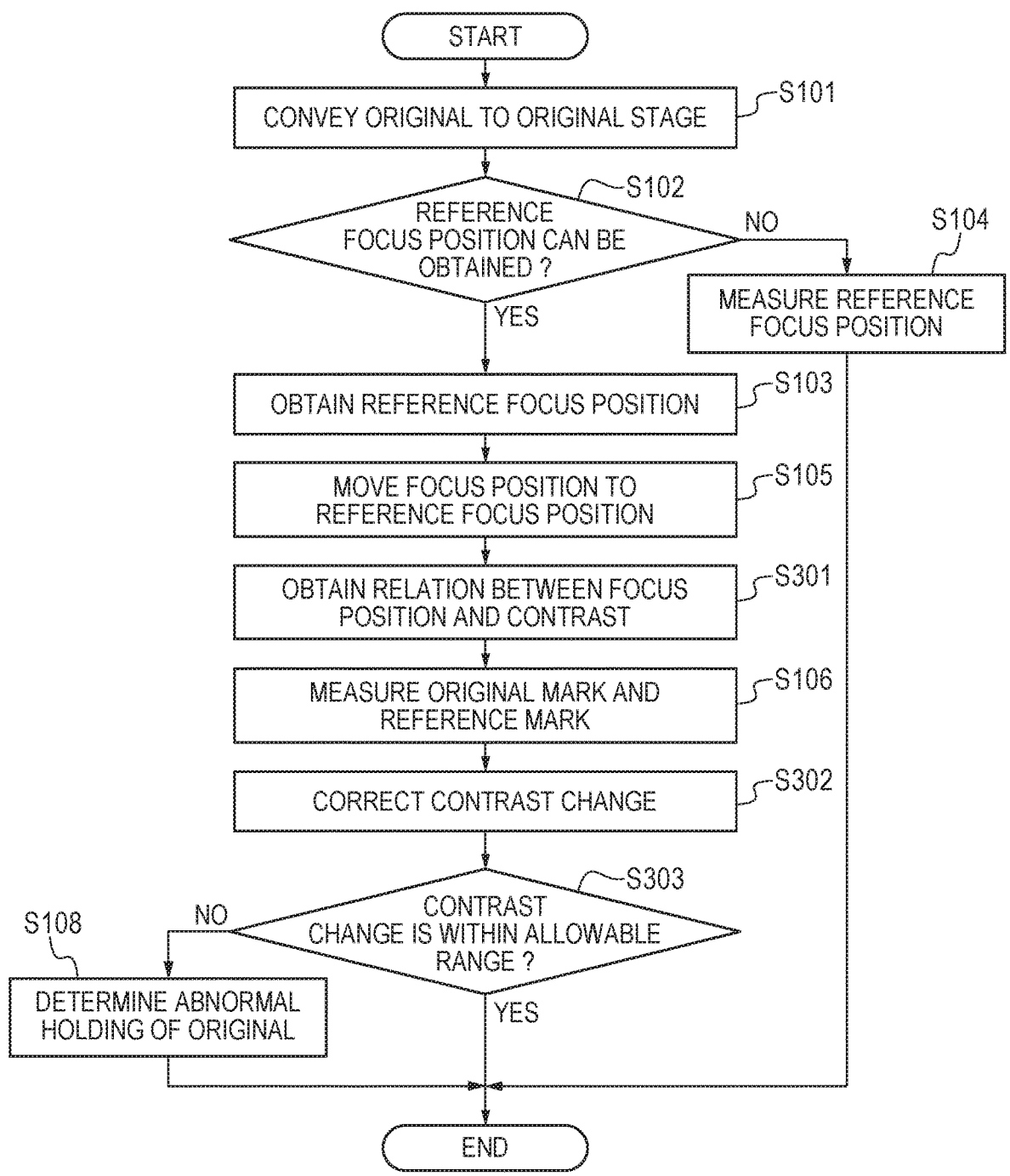
FIG. 10 is a flow chart for illustrating a determination method for the abnormal holding of an original according to a third embodiment of the present invention.

FIG. 10 is a flow chart for illustrating a determination method for the abnormal holding of the original according to the third embodiment. The flow chart of FIG. 10 is different from the flow chart of FIG. 4 in Step S301 to Step S303. Therefore, the descriptions of the other steps are omitted.

In Step S301, the control unit 20 obtains the first contrast information piece obtained in advance from the storing unit in the same manner as in Step S201. In addition, the control unit 20 obtains information (second contrast information piece) indicating a relation between the focus position 11 and the second contrast obtained in advance from the storing unit. In this case, the control unit 20 measures the reference mark 14 while changing the focus position 11 with the original 1 being normally held on the original stage 2, and holds the second contrast information piece in the storing unit. In this case, as a format for holding the second contrast information piece, the second contrast information piece is held in the storing unit as a discrete data set of the focus position 11 and the second contrast. As the format for holding the second contrast information piece, information on a function obtained by approximating the discrete data set by a Gaussian function or a higher-order function using the focus position 11 as a variable may also be used. When a change in the contrast is small, information on a function obtained by approximating the discrete data set by a linear function using the focus position 11 as a variable may be used as well. The second contrast information piece may also be obtained by simulation without actually measuring the contrast. In another case, an external information processing apparatus may hold the second contrast information piece. In this case, the control unit 20 obtains the second contrast information piece from the external information processing apparatus.

In Step S302, the control unit 20 corrects the change in the contrasts of the images of the reference mark 14 and the original mark 12 at the reference position through use of the first contrast information piece and the second contrast information piece. First, the control unit 20 obtains the change amount of the focus position 11 with respect to the original mark 12 through use of the first contrast information piece obtained in Step S301 and the first contrast at the reference position obtained in Step S106. That is, the control unit 20 obtains the movement amount of the graph line regarding the original mark 12 shown in FIG. 9 in the horizontal axis direction with respect to the graph line regarding the original mark 12 shown in FIG. 3.

Next, the control unit 20 obtains the change amount of the focus position 11 with respect to the reference mark 14 through use of the second contrast information piece obtained in Step S301 and the second contrast at the reference position obtained in Step S106. That is, the control unit 20 obtains the movement amount of the graph line regarding the reference mark 14 shown in FIG. 9 in the horizontal axis direction with respect to the graph line regarding the reference mark 14 shown in FIG. 3.

Next, the control unit 20 corrects the change amount of the focus position 11 with respect to the original mark 12 so as to cancel the change amount of the focus position 11 with respect to the reference mark 14. For example, when the graph line regarding the reference mark 14 has been moved in the rightward direction (positive direction) on the horizontal axis, the control unit 20 corrects the graph line regarding the original mark 12 so as to move the graph line in the leftward direction (negative direction) on the horizontal axis. Then, the control unit 20 corrects the first contrast at the reference position (Z=0) through use of the corrected graph line regarding the original mark 12.

Then, the control unit 20 corrects the change amount of the focus position 11 with respect to the reference mark 14 so as to cancel the change amount of the focus position 11 with respect to the reference mark 14. For example, when the graph line regarding the reference mark 14 has been moved in the rightward direction (positive direction) on the horizontal axis, the control unit 20 corrects the graph line regarding the reference mark 14 so as to move the graph line in the leftward direction (negative direction) on the horizontal axis. Then, the control unit 20 corrects the second contrast at the reference position (Z=0) through use of the corrected graph line regarding the reference mark 14.

In Step S303, the control unit 20 obtains the change amount of the first contrast corrected in Step S302 with reference to the second contrast (reference contrast) corrected in Step S302. Then, the control unit 20 determines whether or not the change amount of the first contrast falls out of the allowable range defined in advance. When determining that the change amount of the first contrast is within the allowable range, the control unit 20 brings the processing to an end. When determining that the change amount of the first contrast falls out of the allowable range, the control unit 20 advances the processing to Step S108. In addition, the control unit 20 may obtain the change amount of the first contrast corrected in Step S302 with reference to the first contrast at the reference position obtained from the first contrast information piece obtained in advance.

In Step S302, when a positional change of the measuring unit 8 in the Z-axis direction with respect to the original stage 2 is large, the control unit 20 may determine that the focus is abnormal. For example, the control unit 20 determines whether or not the change amount of the focus position 11 with respect to the reference mark 14 is within an allowable range. When the change amount of the focus position 11 with respect to the reference mark 14 falls out of the allowable range, the control unit 20 may also output an error through the user interface to bring the processing to an end.

The determination method for the abnormal holding of the original according to the third embodiment can be used alone, but can also be used in combination with the determination method for the abnormal holding of the original according to the first embodiment or the second embodiment. That is, the determination method for the abnormal holding of the original according to the third embodiment can be performed when it is determined that the original 1 is being abnormally held on the original stage 2 after the determination method for the abnormal holding of the original according to the first embodiment or the second embodiment is performed.

As described above, according to the third embodiment, it is possible to detect the abnormal holding of the original in a shorter period of time by determining whether or not the change in the contrast of the image of the original mark is within the allowable range. In addition, the change in the first contrast due to the positional change of the measuring unit 8 can be taken into account, and hence it is possible to suppress erroneous detection of the abnormal holding of the original.

Fourth Embodiment

Next, a lithography apparatus according to a fourth embodiment of the present invention is described. It is to be noted that matters not mentioned below may be conformed to the first embodiment to the third embodiment. In the fourth embodiment, an embodiment in which information indicating a relation between the focus position 11 and a first light amount is used to detect the abnormal holding of the original 1 based on a change in the first light amount is described.

Figure 11:
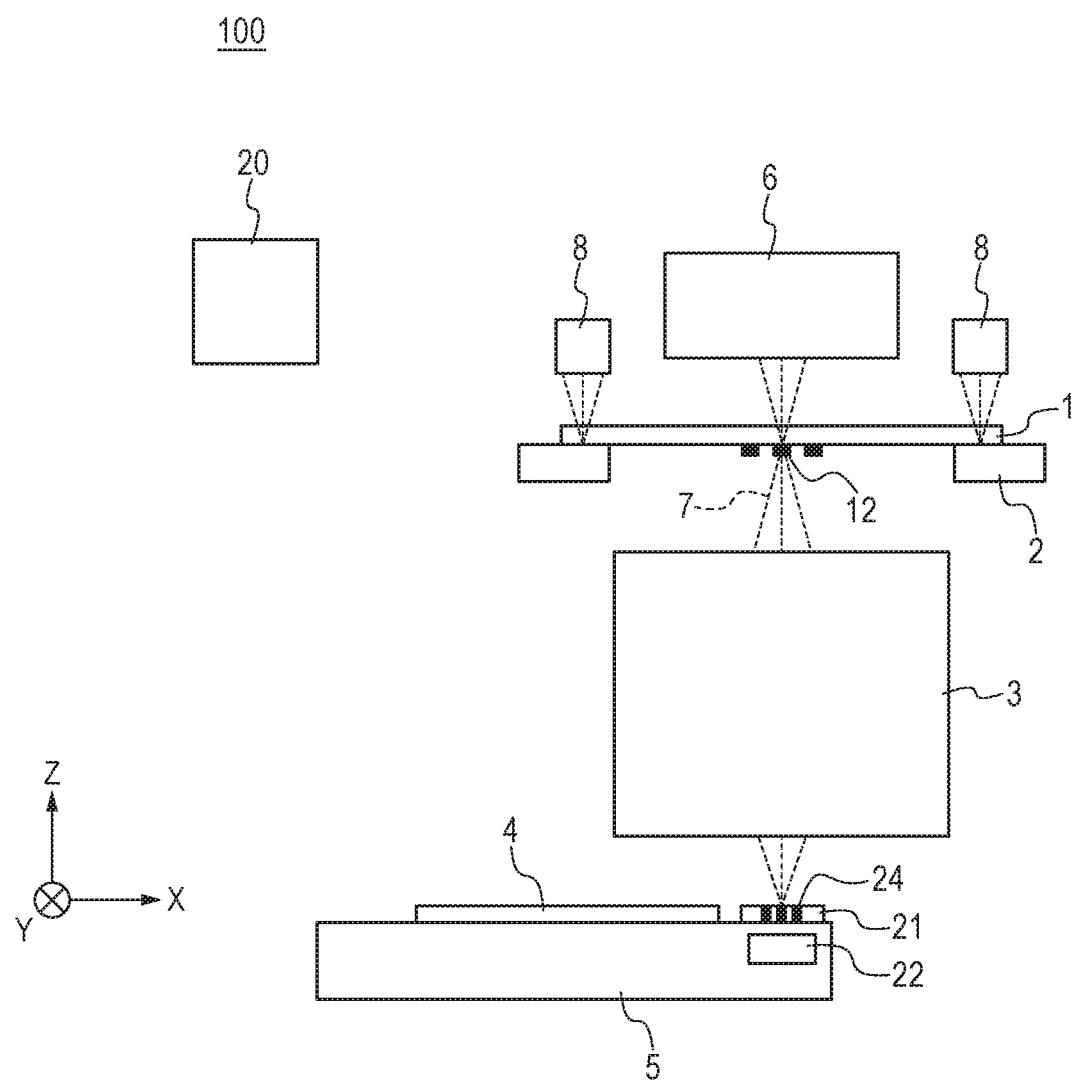
FIG. 11 is a view for illustrating an exposure apparatus according to a fourth embodiment of the present invention.

FIG. 11 is a view for illustrating a lithography apparatus according to the fourth embodiment. The exposure apparatus 100 in the fourth embodiment includes a plate 21 on the substrate stage 5 and a light receiving element 22 configured to measure a light amount inside the substrate stage 5.

Figure 12:
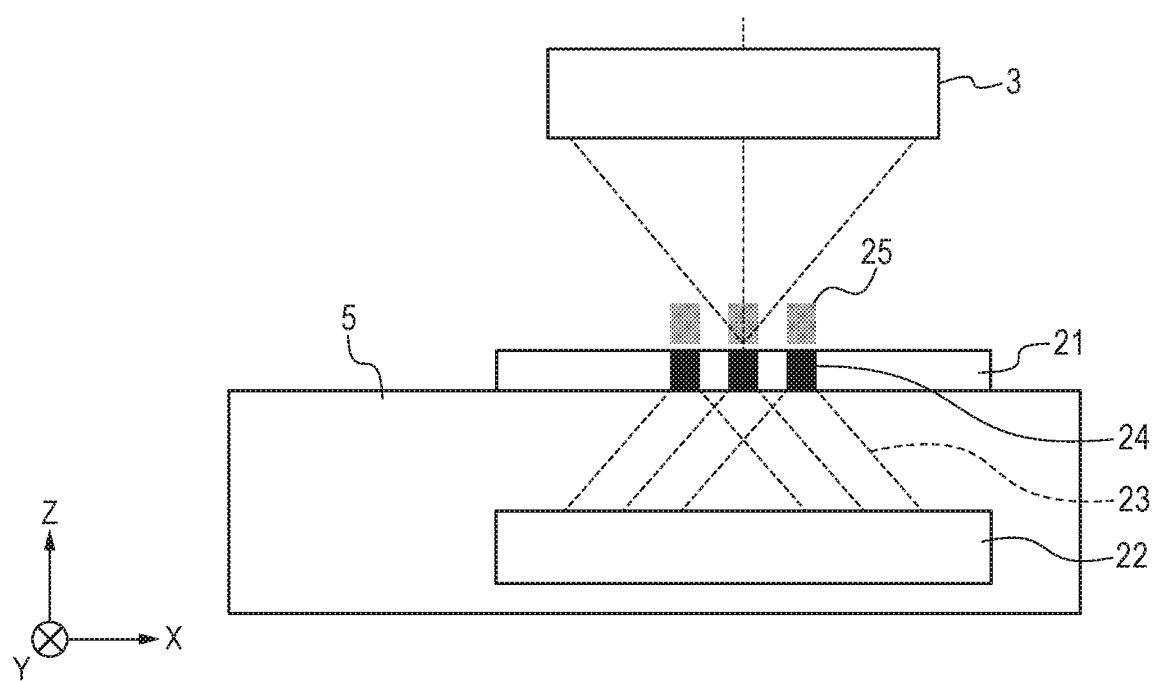
FIG. 12 is a view for illustrating a substrate stage in the fourth embodiment.

FIG. 12 is a view for illustrating the substrate stage 5 in the fourth embodiment. The plate 21 is arranged on the substrate stage 5, and is provided with a reference mark 24 for the measurement of the light amount. The light receiving element 22 is arranged inside the substrate stage 5 and below the plate 21 and the reference mark 24.

The original mark 12 for the measurement of the light amount is provided in an illumination area on the original 1, and the original mark 12 is illuminated by the illumination optical system 6, to thereby form an image 25 of the original mark 12 on the substrate side by the projection optical system 3.

The original mark 12 and the reference mark 24 are designed so that the image 25 of the original mark 12 and the reference mark 24 have the same shape in consideration of the imaging magnification of the projection optical system 3. Therefore, when the image 25 of the original mark 12 and the reference mark 24 are arranged at a position conjugate with each other, the image 25 of the original mark 12 and the reference mark 24 are superimposed on each other, and light from the image 25 of the original mark 12 is transmitted through an opening portion of the reference mark 24. The light amount of transmitted light 23 is measured by the light receiving element 22 arranged below the plate 21. As the reference mark 24 becomes closer to the focus position at which the image 25 of the original mark 12 is formed, the amount of light transmitted therethrough increases, and the light amount measured by the light receiving element 22 increases. In the fourth embodiment, the image 25 of the original mark 12 and the reference mark 24 are set to have the same shape, but the image 25 of the original mark 12 and the reference mark 24 may have different shapes as long as the positional relation between the original 1 and the plate 21 on the substrate stage can be obtained from the shapes.

In addition, the substrate stage 5 is configured to be movable, and hence it is possible to move the plate 21, the reference mark 24, and the light receiving element 22, which are arranged on/in the substrate stage 5. Therefore, the control unit 20 can measure the light amount from the light receiving element 22 while driving the substrate stage 5, and can detect the focus position based on the measured light amount.

Now, processing for detecting the focus position is described. In the processing for detecting the focus position, a reference focus position (hereinafter referred to as "reference position") is determined based on the light amount measured by the light receiving element 22. First, the control unit 20 obtains the light amount of the light 23 measured by the light receiving element 22 while driving the substrate stage 5 in the Z-axis direction. Then, the control unit 20 controls the substrate stage 5 by setting the reference position of the substrate stage 5 to a position at which the obtained light amount is maximized. The control unit 20 also sets the light amount of the light 23 measured at the reference position as a reference light amount.

Figure 13:
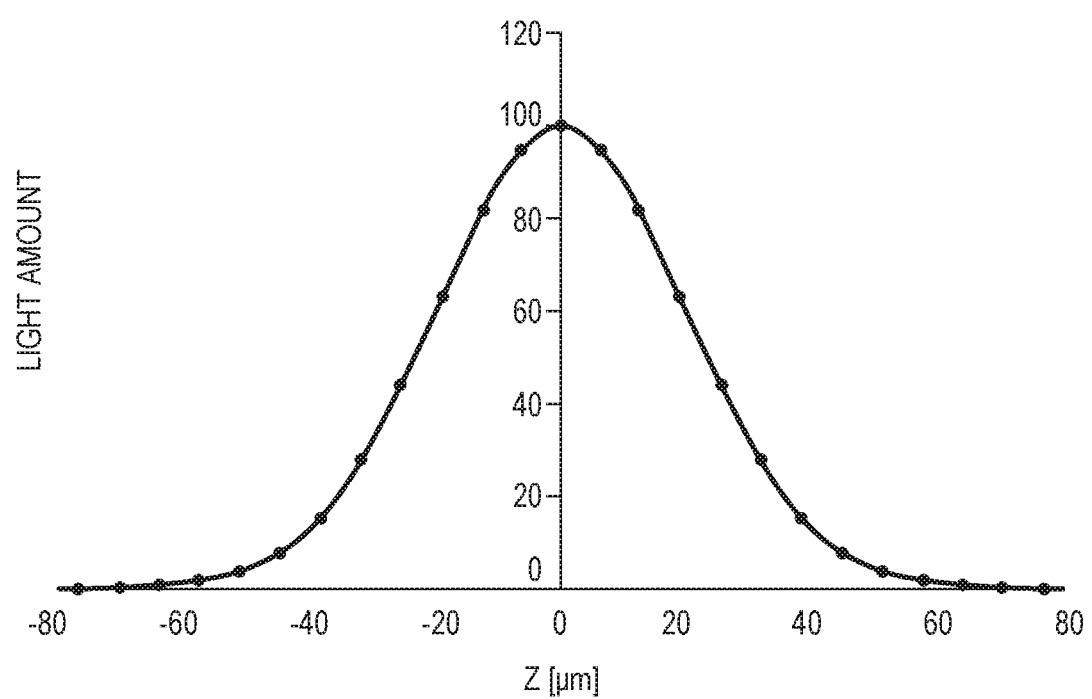
FIG. 13 is a graph for showing a change in the light amount of the image of a mark in the fourth embodiment.

Now, the light amount measured by the light receiving element 22 is described. FIG. 13 is a graph for showing a relation between the position of the substrate stage 5 in the Z-axis direction and the light amount measured by the light receiving element 22. In the graph of FIG. 13, the vertical axis indicates the light amount measured by the light receiving element 22, and the horizontal axis indicates the position of the substrate stage 5 in the Z-axis direction. The reference position of the substrate stage 5 is obtained as the position of the substrate stage 5 at which the light amount is maximized. In the graph of FIG. 13, the reference position is defined to be the origin of the horizontal axis (Z=0 (μm)). In the case of the contrast in the first embodiment, two graph lines of the first contrast and the second contrast are obtained. However, in the fourth embodiment, the light amount of the light 23 transmitted through the opening portion of the reference mark 24 is set as the vertical axis, and hence one graph line of the light amount is obtained.

In this case, by holding the reference position in the storing unit, the control unit 20 can obtain the reference position without being required to measure the mark each time the original 1 is held on the original stage 2. When there are a plurality of originals 1, an imaging position may be measured for each of the plurality of originals 1 to hold a different imaging position for each of the originals 1. An identifier is assigned to each of the plurality of originals 1, and the control unit 20 can obtain the respective reference positions of the plurality of originals 1 by holding the identifier of the original 1 together with the reference position.

Next, the determination method for the abnormal holding of the original 1 is described. As illustrated in FIG. 5, when the foreign substance 16 is sandwiched between the original 1 and the original stage 2 (suction pad 15) to displace the position of the original 1 in the upward direction (positive Z-axis direction), the focus position at which the image 25 of the original mark 12 is formed is also displaced. In that case, the entire graph line is moved in the horizontal axis direction without changing the shape of the graph line in FIG. 13. Therefore, the movement amount of the entire graph line in the horizontal axis direction can be obtained through use of the change amount of the light amount at the reference position (Z=0) and information (light amount information) indicating a relation between the focus position and the light amount. In short, the change amount of the focus position with respect to the image 25 of the original mark 12 can be obtained. When the obtained change amount of the focus position falls out of the allowable range defined in advance, it is possible to determine that the original 1 is being abnormally held on the original stage 2.

Figure 14:
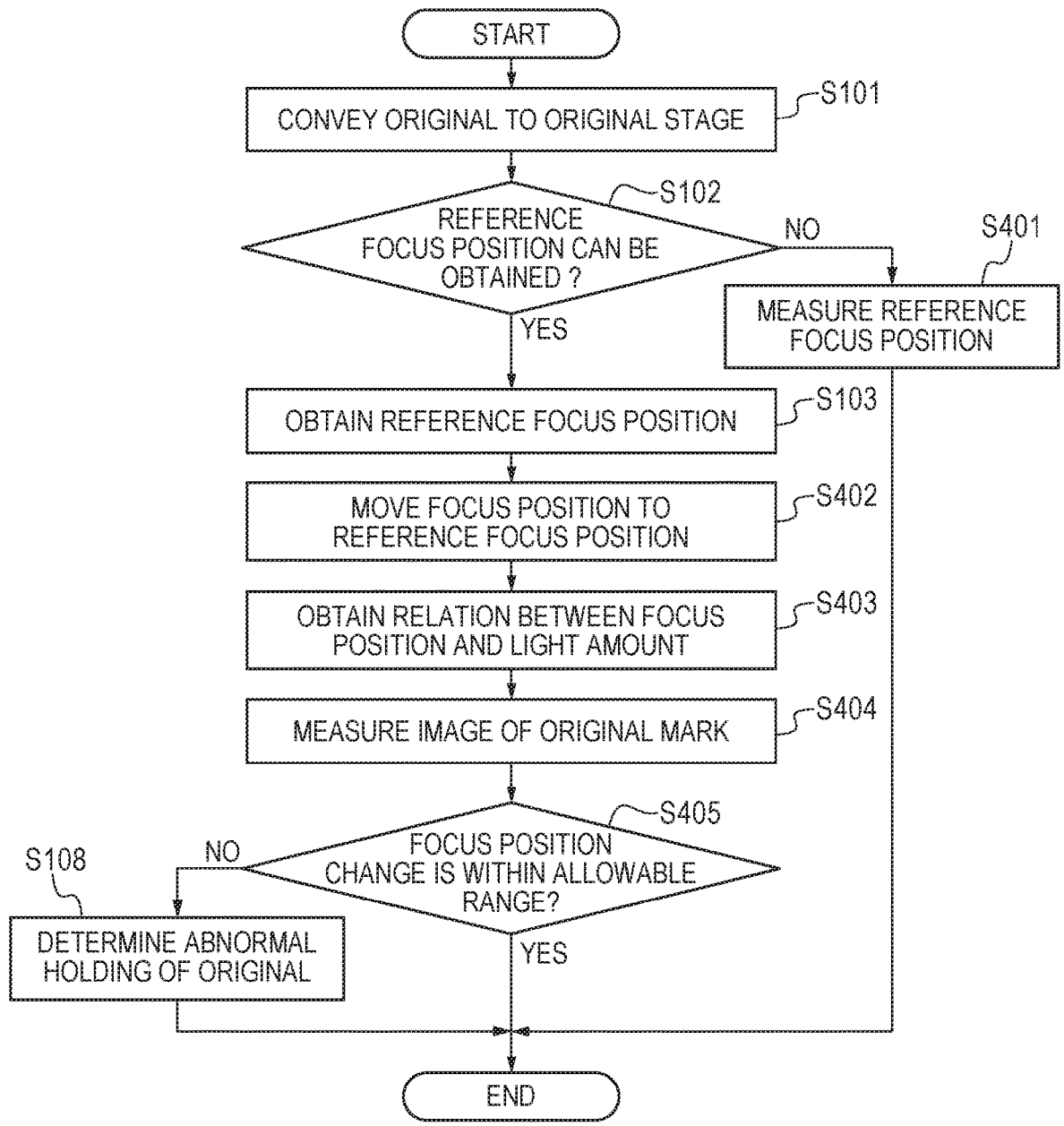
FIG. 14 is a flow chart for illustrating a determination method for the abnormal holding of an original according to the fourth embodiment.

FIG. 14 is a flow chart for illustrating a determination method for the abnormal holding of the original 1 according to the fourth embodiment. The flow chart of FIG. 14 is different from the flow chart of FIG. 4 in Step S401 to Step S405. Therefore, the descriptions of the other steps are omitted.

In Step S401, the control unit 20 controls the substrate stage 5 and the light receiving element 22 to perform the focus measurement processing. That is, the control unit 20 drives the substrate stage 5 to a position at which the light amount of the light 23 measured by the light receiving element 22 is maximized, to thereby obtain the reference position.

In Step S402, the control unit 20 controls the substrate stage 5 to move the position of the substrate stage 5 in the Z-axis direction to the reference position obtained in Step S103.

In Step S403, the control unit 20 obtains from the storing unit light amount information obtained in advance. In this case, the control unit 20 measures the light amount by the light receiving element 22 while changing the position of the substrate stage 5 in the Z-axis direction with the original 1 being normally held on the original stage 2, and holds the light amount information in the storing unit.

In Step S404, the control unit 20 causes the light receiving element 22 to measure the light amount of the light 23, and obtains the light amount at the reference position.

In Step S405, the control unit 20 obtains the change amount of the focus position at which the image 25 of the original mark 12 is formed through use of the light amount information obtained in Step S403 and the light amount at the reference position obtained in Step S404. That is, the control unit 20 obtains the movement amount of the graph line regarding the light amount shown in FIG. 13 in the horizontal axis direction. Then, the control unit 20 determines whether or not the change amount of the focus position at which the image 25 of the original mark 12 is formed falls out of the allowable range defined in advance, and when determining that the change amount is within the allowable range, brings the processing to an end. When determining that the change amount falls out of the allowable range, the control unit 20 advances the processing to Step S108.

As described above, according to the fourth embodiment, it is possible to detect the abnormal holding of the original in a shorter period of time by determining whether or not the change in the focus position at which the image 25 of the original mark 12 is formed is within the allowable range through use of the relation between the focus position and the light amount.

(Method of Manufacturing Article)

A method of manufacturing an article according to the present invention is suitable for manufacturing an article, for example, a semiconductor device, a magnetic storage medium, a liquid crystal display device, or other such device. The manufacturing method includes exposing a substrate to which a photosensitive agent is applied through use of an exposure apparatus (forming a pattern on the substrate) and developing the exposed substrate (processing the substrate). The manufacturing method can also include performing oxidation, film formation, vapor deposition, doping, planarization, etching, resist stripping, dicing, bonding, packaging, and other such known processing. The method of manufacturing an article according to the present invention is advantageous in at least one of the performance, quality, productivity, and production cost of an article as compared to related arts.

Exemplary embodiments of the present invention are described above, but it is to be understood that the present invention is not limited to those embodiments, and various modifications and changes can be made thereto without departing from the spirit of the present invention. The exposure apparatus has been described as an example of the lithography apparatus, but the present invention is not limited thereto.

As an example of the lithography apparatus, there may be used an imprint apparatus configured to form a pattern of an imprint material on a substrate through use of a mold (pattern or template) having an uneven pattern. As another example of the lithography apparatus, there may be used a planarization apparatus configured to perform molding so as to planarize a composition on a substrate through use of a mold (planar template) having a planar portion without an uneven pattern. As still another example of the lithography apparatus, there may be used a drawing apparatus or other such apparatus configured to form a pattern on a substrate by performing drawing on the substrate through use of a charged particle beam (for example, electron beam or ion beam) through a charged particle optical system.

The first to fourth embodiments can also be implemented not only alone but also in any combination of the first to fourth embodiments.

According to at least one embodiment of the present invention, it is possible to provide a lithography apparatus, a determination method, and a method of manufacturing an article, which are capable of detecting the abnormal holding of an original in a shorter period of time.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application No. 2018-225476, filed Nov. 30, 2018, and Japanese Patent Application No. 2019-137785, filed Jul. 26, 2019, which are hereby incorporated by reference herein in their entirety.

What is claimed is:

1. A lithography apparatus configured to form a pattern on a substrate through use of an original, the lithography apparatus comprising:
a holding unit including a second mark and configured to hold the original on which a first mark is formed;
a measuring unit configured to pick up an image of the first mark and an image of the second mark; and
a control unit configured to:
determine a reference position between the first mark formed on a first original included in a plurality of originals and the second mark;
cause the measuring unit to obtain a first image of the first image formed on the first original with a focus position of the measuring unit being adjusted to the reference position; obtain a reference contrast of the first image of the first mark formed on the first original; in a case where a second the original included in the plurality of originals is held by the holding unit, cause the measuring unit to obtain a second image of the first mark formed on the second original with the focus position of the measuring unit being adjusted to the reference position;
obtain a first contrast of the second image of the first mark formed on the second original;
determine whether a change in the first contrast, with respect to the reference contrast, falls out of an allowable range; and
in case where the change falls out of the allowable range, determine that the second original is being abnormally held by the holding unit.

2. The lithography apparatus according to claim 1, wherein the change in the first contrast includes one of a difference and a ratio between the reference contrast and the first contrast.

3. The lithography apparatus according to claim 1, wherein the holding unit is configured to hold the original so that an optical path of light from the first mark to the measuring unit and an optical path of light from the second mark to the measuring unit overlap each other.

4. The lithography apparatus according to claim 1, wherein the first mark and the second mark have the same shape.

5. The lithography apparatus according to claim 1, wherein the control unit is configured to determine that the original is being abnormally held by the holding unit in case where the change in the first contrast, which has been corrected based on a first contrast information piece indicating a relation between the focus position of the measuring unit and the first contrast, with respect to the second contrast, which has been corrected based on a second contrast information piece indicating a relation between the focus position of the measuring unit and the second contrast, falls out of the allowable range.

6. The lithography apparatus according to claim 1, wherein the control unit is configured to perform one of interruption and cancellation of processing for forming the pattern on the substrate when determining that the original is being abnormally held by the holding unit.

7. The lithography apparatus according to claim 1, wherein the control unit is configured to output an error through a user interface when determining that the original is being abnormally held by the holding unit.

8. The lithography apparatus according to claim 1, wherein the control unit is configured to output information for identifying a suction pad involved in the abnormal holding through a user interface when determining that the original is being abnormally held by the holding unit.

9. The lithography apparatus according to claim 1, wherein the first original and the second original are the same.

10. The lithography apparatus according to claim 1, wherein the first original is different from the second original.

11. A lithography apparatus configured to form a pattern on a substrate through use of an original, the lithography apparatus comprising:

a holding unit configured to hold the original on which a first mark is formed;
a projection optical system configured to project an image of the first mark;
a stage being movable, on which a second mark is formed;
a measuring unit configured to measure a light amount of light transmitted through the second mark; and
a control unit configured to:
obtain a reference light amount of light transmitted through the second mark on which first image of the first mark formed on a first original included in a plurality of originals has been projected, measured by the measuring unit, with the second mark being located at a reference position being a focus position at which the first image of the first mark formed on the first original is formed;
in a case where a second original included in the plurality of originals is held by the holding unit, cause the measuring unit to measure a first light amount of light transmitted through the second mark on which a second image of the first mark formed on the second original has been projected with the second mark being located at the reference position by the stage;
determine whether a change in the first light amount with respect to the reference light amount falls out of an allowable range; and
in case where the change falls out of the allowable range, determine that the second original is being abnormally held by the holding unit.

12. The lithography apparatus according to claim 11, wherein the change in the light amount includes one of a difference and a ratio between the reference light amount and the measured light amount.

13. The lithography apparatus according to claim 11, wherein the control unit is configured to obtain the reference position based on the light amount measured by the measuring unit under a state in which the stage is being moved in a direction along an optical axis of the projection optical system.

14. The lithography apparatus according to claim 11, wherein the first mark and the second mark have the same shape.

15. The lithography apparatus according to claim 11, wherein the first original and the second original are the same.

16. The lithography apparatus according to claim 11, wherein the first original is different from the second original.

17. A determination method of determining whether an original to be used when a pattern is formed on a substrate by a lithography apparatus is being abnormally held by a holding unit, the determination method comprising:

determining a reference position between a first mark formed on a first original included in a plurality of originals and a second mark of the holding unit;
obtaining a first image of the first mark formed on the first original with a focus position of a measuring unit being adjusted to the reference position;
obtaining a reference contrast that is a contrast of the first image of the first mark formed on the first original;
in case where a second original included in the plurality of originals is held by the holding unit, obtaining a second image of the first mark formed on the second original with the focus position of the measuring unit being adjusted to the reference position;
obtaining a first contrast of the image of the second mark formed on the second original;
determining whether a change in the first contrast with respect to the reference contrast falls out of an allowable range;
in case where the change falls out of the allowable range, determining that the second original is being abnormally held by the holding unit.

18. A method of manufacturing an article, the method comprising:

determining whether an original to be used when a pattern is formed on a substrate is being abnormally held by a holding unit;
forming the pattern on the substrate through use of the original;
processing the substrate on which the pattern is formed in the forming; and
manufacturing an article from the processed substrate,
determining a reference position between a first mark formed on a first original included in a plurality of originals and a second mark formed on the holding unit;
obtaining a first image of the first mark formed on the first original with a focus position of a measuring unit being adjusted to the reference position;
obtaining a reference contrast that is a contrast of the first image of the first mark formed on the first original;
in a case where a second original included in the plurality of originals is held by the holding unit, obtaining a second image of the first mark formed on the second original with the focus position of the measuring unit being adjusted to the reference position;
obtaining a first contrast of the second image of the first mark formed on the second original;

determining whether a change in the first contrast with respect to the reference contrast, falls out of an allowable range; and in case where the change falls out of the allowable range, determining that the second original is being abnormally held by the holding unit.

19. A determination method of determining whether an original to be used when a pattern is formed on a substrate by a lithography apparatus is being abnormally held by a holding unit, the determination method comprising:

obtaining a reference light amount of light transmitted through a second mark on which a first image of a first mark has been projected, measured by a measuring unit for measuring a light amount of light transmitted through the second mark formed on a movable stage, with the second mark located at a reference position being a focus position at which the first image of the first mark is formed, the first mark being formed on a first original included in a plurality of originals;

in a case where a second original included in the plurality of originals is held by the holding unit, measuring a first light amount of light transmitted through the second mark on which a second image of the first mark formed on the second original has been projected with the second mark being located at the reference position;

determining that the original is being abnormally held by the holding unit in case where a change in the measured light amount with respect to the reference light amount falls out of an allowable range, and in case where the change falls out of the allowable range, determining that the second original is being abnormally held by the holding unit.

20. A method of manufacturing an article, the method comprising:

determining whether an original to be used when a pattern is formed on a substrate is being abnormally held by a holding for holding the original;

forming the pattern on the substrate through use of the original;

processing the substrate on which the pattern is formed in the forming; and manufacturing an article from the processed substrate wherein the determining includes:

obtaining a reference light amount of light transmitted through a second mark on which the image of a first mark has been projected, measured by a measuring unit for measuring a light amount of light transmitted through the second mark formed on a movable stage, with the second mark being located at a reference position being a focus position at which the first image of the first mark is formed, the first mark being formed on a first original included in a plurality of originals;

in a case where a second original included in the plurality of originals is held by the holding unit, measuring a first light amount of light transmitted through the second mark on which a second image of the first mark formed on the second original has been projected with the second mark being located at the reference position;

determining whether a change in the first light amount with respect to the reference light amount falls out of an allowable range; and in case where the change falls out of the allowable range, determining that the second original is being abnormally held by the holding unit.

21. A lithography apparatus configured to form a pattern on a substrate through use of an original, the lithography apparatus comprising:

a holding unit configured to hold the original on which a mark is formed;

a measuring unit configured to measure an optical information of the mark; and a control unit configured to:

cause the measuring unit to measure a first optical information of a first mark formed on a first original included in a plurality of originals, held by the holding unit with a focus position of the measuring unit being adjusted to a predetermined reference position;

in case where a second original, included in the plurality of originals, is held by the holding unit after measuring the first optical information, cause the measuring unit to measure a second optical information of a second mark formed on the second original with the focus position of the measuring unit being adjusted to the predetermined reference position;

determine whether a change in the second optical information with respect to the first optical information falls out of an allowable range; and in case where the change falls out of the allowable range, determine that the second original is being abnormally held by the holding unit.

22. The lithography apparatus according to claim 21, wherein the first original and the second original are the same.

23. The lithography apparatus according to claim 21, wherein the first original is different from the second original.

24. The lithography apparatus according to claim 21, wherein the first optical information corresponds to a contrast of an image of the first mark, and the second optical information corresponds to a contrast of an image of the second mark.

25. The lithography apparatus according to claim 21, wherein the first optical information corresponds to a light amount of light for projecting an image of the first mark, and the second optical information corresponds to a light amount of light for projecting an image of the second mark.

26. A determination method of determining whether an original to be used when a pattern is formed on a substrate by a lithography apparatus is being abnormally held by a holding unit, the determination method comprising:

measuring, by a measuring unit for measuring an optical information of a mark formed on the original, a first optical information of a first mark formed on a first original, included in a plurality of originals, held by the holding unit with a focus position of the measuring unit being adjusted to a predetermined reference position;

in case where a second original included in the plurality of originals is held by the holding unit after measuring the first optical information, measuring a second optical information of a second mark formed on the second original with the focus position of the measuring unit being adjusted to the predetermined reference position; and determining that whether a change in the second optical information with respect to the first optical information falls out of an allowable range; and in case where the change falls out of the allowable range, determining that the second original is being abnormally held by the holding unit.

27. A method of manufacturing an article, the method comprising:

determining whether an original to be used when a pattern is formed on a substrate is being abnormally held by a holding unit;

forming the pattern on the substrate through use of the original;
processing the substrate on which the pattern is formed in the forming; and
manufacturing an article from the processed substrate,
wherein the determining includes:
measuring, by a measuring unit for measuring an optical information of a mark formed on the original, a first optical information of a first mark formed on a first original, included in a plurality of originals, held by the holding unit with a focus position of the measuring unit being adjusted to a predetermined reference position;
in case where a second original included in the plurality of originals is held by the holding unit after measuring the first optical information, measuring a second optical information of a second mark formed on the second original with the focus position of the measuring unit being adjusted to the predetermined reference position;
determining whether a change in the second optical information with respect to the first optical information falls out of an allowable range; and
in case where the change falls out of the allowable range, determining that the second original is being abnormally held by the holding unit.

* * * * *